United States Patent

Marty et al.

[11] Patent Number: 5,976,898
[45] Date of Patent: Nov. 2, 1999

[54] LOCALIZATION OF DEFECTS OF A METALLIC LAYER OF A SEMICONDUCTOR CIRCUIT

[75] Inventors: Michel Marty, Varces; Alain Brun, Vif, both of France

[73] Assignee: STMicroelectronics S.A., Gentilly, France

[21] Appl. No.: 08/770,476

[22] Filed: Dec. 20, 1996

[30] Foreign Application Priority Data

Dec. 22, 1995 [FR] France ................................. 95 15786

[51] Int. Cl.⁶ ........................... G01R 31/26; H01L 21/00; H01L 21/66
[52] U.S. Cl. ................................................. 438/12; 438/17
[58] Field of Search .................... 438/17, 18, 10, 438/12

[56] References Cited

U.S. PATENT DOCUMENTS

| | | | |
|---|---|---|---|
| 4,968,932 | 11/1990 | Baba et al. | 324/158 D |
| 5,329,139 | 7/1994 | Sanada | 257/48 |
| 5,365,034 | 11/1994 | Kawamura et al. | 219/121.83 |
| 5,430,305 | 7/1995 | Cole, Jr. et al. | 250/559.07 |

*Primary Examiner*—Brian Dutton
*Attorney, Agent, or Firm*—David V. Carlson; Seed and Berry LLP

[57] ABSTRACT

A method for locating possible defects on an opaque layer deposited on a production wafer of a semiconductor circuit, consisting in locally radiating an upper surface of the wafer by means of a laser, and detecting the occurrence of a current in a diode constituted by a PN junction placed under the opaque layer to be examined.

19 Claims, 1 Drawing Sheet

LOCALIZATION OF DEFECTS OF A METALLIC LAYER OF A SEMICONDUCTOR CIRCUIT

BACKGROUND OF THE PRESENT INVENTION

1. Field of the Present Invention

The present invention relates to a method for detecting and locating defects in an opaque layer of a semiconductor circuit. The present invention more particularly applies to the detection, the localization and the analysis of possible defects in a metallic track or a metallic polysilicide track of a multiple layer circuit including several levels of interconnects.

2. Discussion of the Related Art

Defects are likely to occur in metallic tracks of semiconductor circuits. These defects generally appear as a cross-sectional defect of the conductive track which modifies the current flow conditions for which the track has been provided.

The defects can have an electrical, mechanical or chemical origin. An electrical defect may, for example, be due to a displacing of the atoms under the effect of an electron flow caused by the current which flows through the track and generates the local heating of an area of the track which can cause its total or partial melting. Mechanical defects are, for example, due to thermal stress to which the circuit is submitted and which causes the diffusion or the extrusion of the metal. Chemical defects may, for example, be due to corrosion.

Several conventional methods of observation of possible defects in interconnecting layers present in a semiconductor circuit are known.

A first method consists in using an optical microscope to examine the semiconductor circuit. Such a method can only be applied to large structures (of several micrometers) for the detection of significant defects.

A second method consists in using a scanning electron microscope to examine the circuit. In a backscattered electron analysis mode, this method provides a large spatial resolution but it only applies to apparent layers. Thus, in the case of a multiple layer circuit, it is necessary to previously perform a pickling of the upper layers, for example by using chemical means or plasma, which may generate interpretation errors, and generate further defects or suppress existing defects in the circuit. The scanning electron microscope may be used in a potential contrast analysis mode, but this method requires the application of a potential to the metallic track, which may result in the closing of defects under the effects of an electric arc.

A third, so-called "thermal wave" method, consists in using a first laser (pulsed) for heating one point of the circuit and then surveying the point between two pulses of the laser with a second continuous low power laser. The survey measures variations in the reflectivity of the metallic track at the point under the effect of temperature. A measuring device enabling the implementation of such a method is, for example, commercialized by Thermawave under trade name Imager®. An advantage of such a method is that it has an important spatial resolution and is simple to use. However, in order not to be destructive, the power of the lasers must be limited (around 5 mW), which may limit the depth of the layers likely to be examined with respect to the surface of the circuit. The operating limit in depth generally is around 2 $\mu$m. Yet, it is now more and more frequent to make multiple layer semiconductor circuits having a depth which can go up to around ten micrometers. Moreover, even in a non-destructive operating range of the laser, the pulsed heating-signal effect is dispersed for a buried semiconductor layer and thus the detection signal is strongly weakened, which leads to the variations of reflectivity being difficult to measure.

The third method is also used for the localization of defects in metallic polysilicide layers which behave in the same way as a metallic layer as concerns reflectivity to the laser beam. This method enables, for example, the detection of polysilicon layers which are poorly silicided.

SUMMARY OF THE PRESENT INVENTION

The present invention aims at providing a method for locating possible defects in metallic or polysilicide layers which is non-destructive while enabling a survey of deeply buried layers.

The present invention also aims at enabling a defect localization in an end product.

The present invention also aims at providing a method for locating possible defects which may be implemented during the circuit manufacturing process.

The present invention also aims at providing a method for locating possible defects in a metallic layer meant to be used as a fuse.

More generally, the present invention provides a method for locating possible defects in an opaque layer of an electronic component.

The present invention also aims at enabling the localization of possible defects in a test region of any electronic component.

The present invention further aims at enabling the localization of possible defects in any region of a bipolar semiconductor circuit.

To achieve one or more of these objects, the present invention provides a method for locating possible defects of an opaque layer deposited on a production wafer of a semiconductor circuit. The method includes subjecting a localized area on an upper surface of the wafer to radiation by means of a laser, and detecting the occurrence of a current in a diode constituted by a PN junction placed under the opaque layer to be examined.

According to one embodiment of the invention, two terminals for connecting the detection diode are formed on the upper surface of the wafer during the formation of the semiconductor circuit.

According to another embodiment of the invention, at least one transparent layer is interposed between the detection diode and the opaque layer. According to another embodiment of the invention, at least one transparent layer is interposed between the opaque layer and the upper surface of the wafer. According to another embodiment of the present invention, the PN junction is formed in a silicon substrate from which the circuit is made. According to another embodiment of the present invention, the opaque layer is a metallic interconnect track. According to another embodiment of the present invention, the opaque layer is made of metallic polysilicide.

The present invention also provides a multiple-layer semiconductor circuit that includes a test region having a plurality of opaque layers and transparent layers under which is placed a PN junction that constitutes a diode accessible from an upper surface of the circuit by means of terminals and vias.

BRIEF DESCRIPTION OF THE DRAWINGS

These objects, features and advantages, as well as others, of the present invention will be discussed in detail in the following description of specific embodiments, taken in conjunction with the following drawings, but not limited by them.

For clarity, the same components have been referred to by the same reference numerals in the different figures. For clarity still, the representations are not to scale and only the components and layers necessary for the understanding of the present invention have been shown.

DETAILED DESCRIPTION

Figure 1:
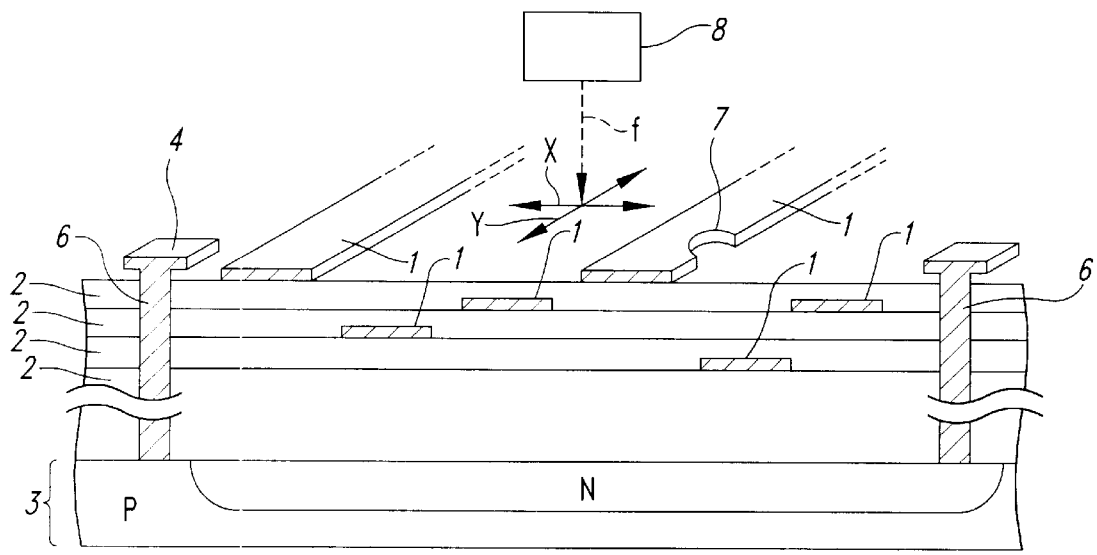
FIG. 1 is a cross-sectional view of a test region of a semiconductor circuit according to one embodiment of the invention.

FIG. 1 illustrates an implementation mode of the method of localization of possible defects of a metallic layer according to an embodiment of the invention. FIG. 1 shows, partially and in a cross-sectional view, a multiple-layer test structure of a semiconductor circuit according to this embodiment of the invention.

The test structure includes alternating layers of metallic tracks 1 and of insulating layers 2 placed outside of a useful region (not shown) of the semiconductor circuit. The metallic tracks 1 and insulating layers 2 form a multiple-layer test structure in the circuit. Generally, a metallic track 1 is made for each metallization layer in the useful region of the circuit.

According to an embodiment of the invention, a PN junction constituting a detection diode 3 is formed in the semiconductor circuit under the multiple layer test region. The detection diode 3 is accessible, from an upper surface of the circuit, via two connection terminals 4 and 5 which are respectively connected, through vias 6, to the N and P-doped regions of the detection diode 3.

Still referring to FIG. 1, the surface of the multiple-layer test region is scanned by a laser beam f. The laser beam f is generated by a laser 8. When the laser beam f is incident in the neighborhood of the PN junction, it causes the creation of electron/hole pairs in the silicon and the PN junction becomes conductive if the PN junction is reversed biased. The current generated in the PN junction by the laser beam f may be called a photocurrent.

According to an embodiment of the invention, advantage is taken of the fact that the metallic layers or metallic polysilicide layers are opaque to the laser beam f, whereas the insulating layers 2, which are generally oxide, nitride, or glass layers, are transparent to the laser beam f. Thus, the metallic tracks 1 constitute screens for the laser beam f. No current flows through the detection diode 3 when the laser beam f illuminates a metallic track 1. Conversely, when the laser beam f illuminates a defect 7 which appears as a local lack of metallization in a metallic track 1, the transparent insulating layers 2 allow the laser beam f to pass through until it reaches the PN junction. When the laser beam f is incident on the PN junction, it generates a current through the detection diode 3 if the detection diode 3 is reverse-biased.

According to an embodiment of the invention, the localization of possible defects in the opaque layer of metallic tracks 1 is performed by scanning the surface of the multiple-layer test region with the laser beam f. The scanning procedure is generally performed by displacing the laser 8, or preferentially the semiconductor circuit to be examined, in two perpendicular directions (symbolized by arrows X and Y in FIG. 1).

An advantage of the disclosed embodiments of the invention is that a metallic track 1 does not need to be apparent or close to the surface of the circuit to be effectively examined. The metallic track 1 can thus be covered by one or several transparent layers. Similarly, and as shown in FIG. 1, the metallic track 1 can be separated from the detection diode 3 by one or several insulating layers 2.

It should be noted that no opaque layer other than that which is to be examined may be interposed between the laser beam f and the PN junction constituting the detection diode 3. Indeed, if this should happen, the additional opaque layer would act as a screen against the optical path of the laser beam f and would not allow the detection of defects in the layer to be examined, whether it was located above or below the additional layer.

Another advantage of the disclosed embodiments of the invention is that they enable a localization of possible defects in metallic or polysilicide layers during the manufacturing process of a multiple-layer semiconductor circuit or after the circuit has been completed.

Electrical (electro-migrations), mechanical (thermal), or chemical (corrosion) stress can occur in the production of multiple-layer semiconductor circuits before a scan is performed according to an embodiment of the invention. An implementation of the method according to an embodiment of the invention can be performed either after deliberate stress has been applied to the circuit once or several times during a quality inspection of the circuit, or to detect possible defects during a maintenance control routine.

Another advantage of the disclosed embodiments of the invention is that they do not require any powering-on of the metallic track 1 to be implemented. The possibility that existing defects would disappear during a power-on state is thus avoided. Another advantage of the embodiments of the invention is that the measurements are independent of the pattern of the metallic track 1 to be examined. Indeed, a scan of laser beam f over the circuit surface enables a survey of any pattern, even the three-dimensional pattern of structures such as vias, steps, etc.

A measurement of the photocurrent in the detection diode 3 can be servo-controlled by the scan of the laser beam f in order to obtain a three-dimensional image of the metallic track 1 to be examined.

The spatial resolution of the localization performed by the method according to an embodiment of the invention depends on the concentration of the laser beam f. It should be noted that a laser beam with a very small diameter can generate a current in the PN junction which is significant enough to give a large sensitivity to the measurements. For example, a few micro-amperes may be generated by a laser beam that irradiates a surface area of approximately $0.2\,\mu m^2$.

Another advantage of the disclosed embodiments of the invention is that they can be implemented in a useful region of a completed bipolar semiconductor circuit. Indeed, a bipolar circuit includes a multitude of PN junctions which can be used to implement the described defect localization method. It is sufficient, for this method, that a PN junction is located under an opaque layer to be examined and is accessible through two connection terminals.

Figure 2:
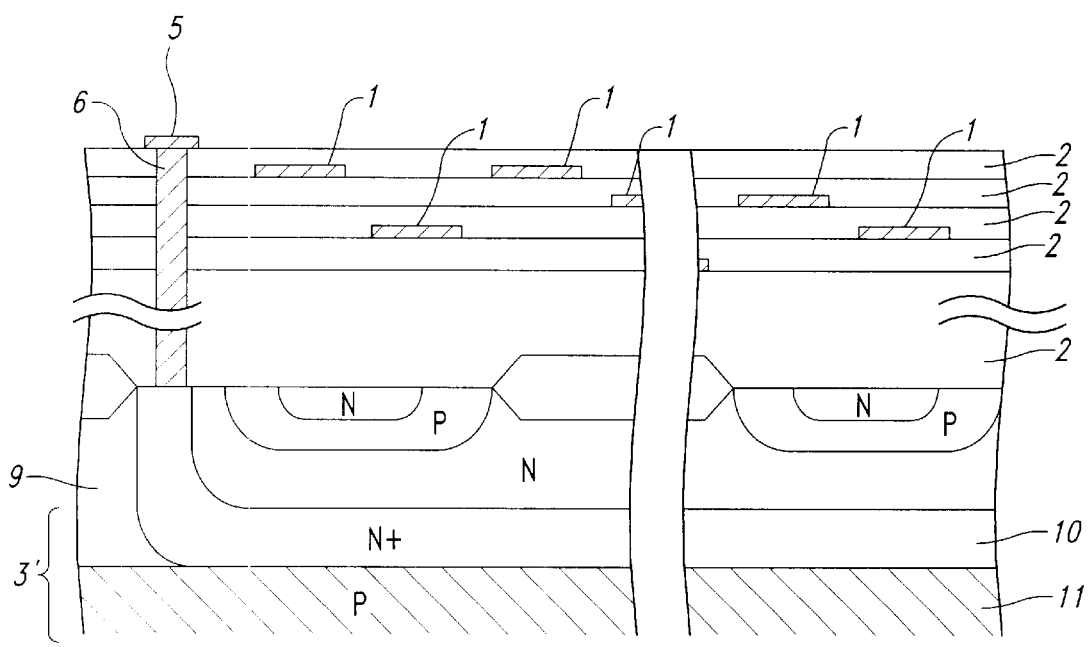
FIG. 2 is a cross-sectional view of a bipolar circuit to be analyzed by a method according to one embodiment of the invention.

FIG. 2 shows an example of a multiple layer bipolar semiconductor circuit to which a method according to an embodiment of the invention can be applied. This example shows different buried layers of NPN-type bipolar transistors.

In the example shown in FIG. 2, the junction between an N-type epitaxial layer 9 and a P-type silicon substrate 11 of the semiconductor circuit is used as a PN junction constituting a detection diode 3'. To access the layer 9, a contact may be established with an N+-type buried layer 10 which is accessible from the upper surface of the circuit through a terminal 5 connected by means of a via 6. A terminal for connection to the substrate (not shown) is generally present in every circuit.

It should be noted that the disclosed embodiments of the invention apply to the localization of defects in a metallic interconnect track as well as to the localization of defects in a polysilicide layer. An examination of a polysilicide layer may be performed in a test region similar to the one shown in FIG. 1.

More generally, the disclosed embodiments of the invention apply to the detection of defects in any opaque layer, provided that the layer is separated from a laser beam source and a detection diode by transparent layers only.

It should also be noted that the disclosed embodiments of the invention enable an examination of the conduction of a metallic layer meant to be used as a fuse. Indeed, as the localization performed by the method according to the disclosed embodiments does not generate any current or voltage in the opaque layer to be analyzed, there is no risk of triggering the fuse during the localization.

The laser 8 used in the method according to the disclosed embodiments of the invention can be a conventional laser for exciting a measuring device by thermal waves, such as the above-mentioned Imager® device. In these embodiments, only the excitation laser is used, while the detection laser is not used. It could, however, be provided to use such a measuring device, either in thermal wave detection when the layer to be examined is not too deep (less than 2 μm), or by means of the disclosed methods to locate possible defects in a deeper layer. Thus, in the implementation of a bipolar semiconductor circuit, it can be provided to only make accesses to detection diodes located under tracks to be checked, when these tracks are at such a depth that they exit the operating range of thermal wave measurement.

Of course, other embodiments of the present invention may have various alterations, modifications and improvements. Especially, each of the layers described can be replaced by one or several layers performing the same function. Similarly, the implementation of the present invention and the exploitation of the measurements performed are conventional according to the functional indications given hereabove. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for detecting defects in an opaque layer of a semiconductor wafer, comprising:
   projecting a directed light source beam onto a surface of the semiconductor wafer;
   reverse biasing a PN junction located in the semiconductor wafer proximate to the opaque layer wherein at least one transparent layer is interposed between the opaque layer and the PN junction; and
   detecting a current flow in the PN junction.

2. The method of claim 1, further comprising:
   providing a circuit in the semiconductor wafer; and
   connecting two terminals to the PN junction while providing the circuit in the semiconductor wafer.

3. The method of claim 1 wherein the opaque layer includes a metal interconnect track and reverse biasing the PN junction located in the semiconductor wafer proximate to the opaque layer includes reverse biasing the PN junction proximate to the metallic interconnect track.

4. The method of claim 1 wherein the opaque layer includes metallic polysilicide and reverse biasing the PN junction located in the semiconductor wafer proximate to the opaque layer includes reverse biasing the PN junction proximate to the metallic polysilicide.

5. A method for detecting defects in an opaque layer of a semiconductor wafer, comprising:
   projecting a directed light source beam onto a surface of the semiconductor wafer;
   reverse biasing a PN junction proximate to the opaque layer wherein at least one transparent layer is interposed between the directed light source beam and the opaque layer, the opaque layer being located between the directed light source beam and the PN junction: and
   detecting a current flow in the PN junction.

6. The method of claim 5, further comprising the steps of:
   applying stress to the semiconductor wafer;
   locating a plurality of vias between the PN junction and a plurality of terminals;
   scanning the surface of the semiconductor wafer with the directed light source beam; and
   wherein the semiconductor wafer includes a bipolar semiconductor circuit and the directed light source beam is a pulsed beam.

7. The method of claim 6 wherein scanning the surface of the semiconductor wafer includes moving the semiconductor wafer relative to the directed light source beam.

8. The method of claim 6 wherein scanning the surface of the semiconductor wafer includes moving the directed light source beam relative to the semiconductor wafer.

9. The method of claim 5 wherein the transparent layer includes at least one of oxide, nitride and glass, further comprising passing the directed light source beam through one of the oxide nitride and glass.

10. The method of claim 5 wherein detecting a current flow in the PN junction includes detecting the current flow passing through a terminal coupled to the PN junction.

11. A method for detecting defects in an opaque layer of a semiconductor wafer, comprising:
    projecting a directed light source beam toward the semiconductor wafer;
    reverse biasing a PN junction proximate to the opaque layer;
    passing the directed light source beam through a transparent layer interposed between the opaque layer and the PN junction; and
    detecting a current flow in the PN junction.

12. The method of claim 11 wherein passing the directed light source beam through a transparent layer includes passing the directed light source beam though at least one of an oxide, a nitride and a glass.

13. The method of claim 11 wherein detecting a current flow in the PN junction includes detecting a current flow through a terminal coupled to the PN junction with a via.

14. The method of claim 11, further comprising moving at least one of the directed light source beam and the semiconductor wafer relative to the other of the directed light source beam and the semiconductor wafer to scan the directed light source beam across a surface of the semiconductor wafer.

15. A method for detecting defects in an opaque portion of a semiconductor wafer, comprising:

reverse biasing a PN junction proximate to the opaque portion;

directing a light source beam toward the opaque portion;

positioning at least one of the light source beam and the opaque portion relative to the other of the light source beam and the opaque portion to block at least a portion of the light beam from passing to the PN junction;

moving at least one of the light source beam and the opaque portion relative to the other of the light source beam and the opaque portion to allow the light source beam to pass through a defect area of the opaque portion to the PN junction; and monitoring the PN junction to detect a current flow at the PN junction.

16. The method of claim 15 wherein the opaque portion is the only opaque portion along an optical path taken by the light source beam toward the PN junction and positioning the one of the light source beam and the opaque portion includes positioning the one of the light source beam and the only opaque portion to block at least a portion of the light beam from passing to the PN junction.

17. The method of claim 15 wherein detecting a current flow at the PN junction includes detecting a current flow while no electrical power is applied to the PN junction.

18. The method of claim 15 wherein moving at least one of the light source beam and the opaque portion includes aligning the light source beam with a gap in the opaque portion to allow the light source beam to pass to the PN junction.

19. The method of claim 15 wherein the opaque portion includes at least a portion of a fuse and positioning at least one of the light source beam and the opaque portion relative to the other of the light source beam and the opaque portion to block at least a portion of the light beam from passing to the PN junction includes impinging the light source beam on the opaque portion without triggering the fuse.

* * * * *